US010666213B2

(12) United States Patent
Awny et al.

(10) Patent No.: US 10,666,213 B2
(45) Date of Patent: May 26, 2020

(54) AMPLIFICATION CIRCUIT WITH READ/WRITE CIRCUIT

(71) Applicant: IHP GmbH—Innovations for High Performance Microelectronics/Leibniz-Institut fur Innovative Mikroelektronik, Frankfurt (Oder) (DE)

(72) Inventors: Ahmed Awny, Langenhagen (DE); Alexey Balashov, Frankfurt (DE); Dietmar Kissinger, Buckenhof (DE)

(73) Assignee: IHP GMBH—INNOVATIONS FOR HIGH PERFORMANCE MICROELECTRONICS/LEIBNIZ-INSTITUT FUR INNOVATIVE MIKROELEKTRONIK (DE)

( * ) Notice: Subject to any disclaimer, the term of this patent is extended or adjusted under 35 U.S.C. 154(b) by 0 days.

(21) Appl. No.: 16/106,108

(22) Filed: Aug. 21, 2018

(65) Prior Publication Data
US 2019/0068151 A1  Feb. 28, 2019

(30) Foreign Application Priority Data
Aug. 28, 2017 (EP) .................................... 17188205

(51) Int. Cl.
*H03G 3/20* (2006.01)
*H03G 3/30* (2006.01)
*H03F 3/45* (2006.01)
*H03G 3/02* (2006.01)
*H03G 3/04* (2006.01)

(52) U.S. Cl.
CPC .......... *H03G 3/30* (2013.01); *H03F 3/45475* (2013.01); *H03G 3/02* (2013.01); *H03G 3/04* (2013.01); *H03F 2200/435* (2013.01); *H03F 2203/45146* (2013.01); *H03F 2203/45276* (2013.01); *H03F 2203/45521* (2013.01); *H03G 3/3052* (2013.01); *H03G 2201/103* (2013.01)

(58) Field of Classification Search
CPC .................................. H03G 3/20; H03G 3/30
USPC .................................................. 330/129, 279
See application file for complete search history.

(56) References Cited

U.S. PATENT DOCUMENTS

2006/0006940 A1* 1/2006 Hu ...................... H03G 1/0088
330/129
2009/0040059 A1  2/2009 Dauphinee et al.

OTHER PUBLICATIONS

Rajanish Pandey, et al; "Highly Integrated Quad-Channel Transimpedance Amplifer for Next Generation Coherent Opetical Receiver"; 2016 IEEE Compound Semiconductor Integrated Circuit Symposium; Oct. 23, 2016; pp. 1-4.

* cited by examiner

*Primary Examiner* — Steven J Mottola
(74) *Attorney, Agent, or Firm* — Ware, Fressola, Maguire & Barber LLP

(57) ABSTRACT

The invention relates to an amplification circuit (100), comprising: a VGA (2), an AGC loop (10) for automatically controlling the gain of the VGA (2), a switching circuit (14) for switching between an AGC mode, in which the gain of the VGA (2) is automatically controlled by an output signal of the AGC loop (10) and a manual gain control, MGC, mode, in which the gain of the VGA (2) can be manually controlled by an input signal, and a read/write circuit (30) with a contact (31) for connection to a peripheral system, wherein the read/write circuit (30) is configured, in the MGC mode, to provide the input signal from the contact (31) via a write-mode path (32) to the VGA (2), and, in the AGC mode, to provide the output signal of the AGC loop (10) via a read-mode path (33) on the contact (31).

15 Claims, 3 Drawing Sheets

AMPLIFICATION CIRCUIT WITH READ/WRITE CIRCUIT

CROSS REFERENCE TO RELATED APPLICATION

This application claims priority under 35 USC § 119 to European Patent Application No. 17188205.3 filed on Aug. 28, 2017, which application is hereby incorporated by reference in its entirety.

FIELD OF THE INVENTION

The invention relates to an amplification circuit comprising a variable gain amplifier, VGA, and an automatic gain control, AGC, loop for automatically controlling the gain of the VGA. The invention further relates to a method for operating the amplification circuit.

BACKGROUND OF THE INVENTION

Variable gain amplifiers (VGAs) are important building blocks in systems where amplification and processing of analog signals with low distortion over a high input dynamic range is required. FIG. 1 (a) shows schematically and exemplarily an amplification circuit 1 comprising a VGA 2 and an automatic gain control (AGC) loop 10 that shall ensure that only minimal distortion is introduced by the VGA over a wide dynamic range of the input. The AGC loop 10 comprises a peak detector 11, which outputs a DC signal proportional to the amplitude at the output voltage $V_{out}$ of the VGA 2. The output of the peak detector 11 is compared with a desired output amplitude provided on the pin OA through an operational amplifier (OpAmp) 12 and the error signal at the output of the OpAmp 12 is used to automatically set the gain of the VGA 2 to maintain the amplitude of the output voltage $V_{out}$ at a constant level, even if the input amplitude to the VGA 2 changes. When the amplification circuit 1 is embedded in a larger system, it is usually beneficial to have two switchable modes of operation: an AGC mode, in which the gain of the VGA 2 is automatically set by the OpAmp 12 and a manual gain control mode (MGC), in which the gain can be set manually by controlling the input via the pin GC (gain control). In both modes, the output of the peak detector 11 is available through a buffer 13 on a pin PKD as an output to a peripheral system (not shown in the figure). The pin MS (mode selection) can be used to switch between the two modes through a switching circuit 14, wherein when MS is logic zero, the MGC mode is activated, and when MS is logic one, the AGC mode is activated.

A detailed view of an exemplary implementation of the switching circuit 14 is shown in FIG. 1 (b). The switching circuit 14 is formed by two complementary transmission gates and comprises a selection signal input 15 connected to the pin MS, a first signal input 16 connected to the pin GC, a second signal input 17 connected to the output of the OpAmp 12 and an output 18 connected to the gain control setting input of the VGA ($VGA_{GC}$). The two complementary transmission gates comprise an inverter 19, a first pair of an NMOS transistor 20 and a PMOS transistor 21 (first transmission gate) and a second pair of an NMOS transistor 22 and a PMOS transistor 20 (second transmission gate). The first transmission gate 20, 21 is configured to allow signals to pass through from the first signal input 16 to the output 18 in response to the selection signal input 15 being driven low (logic zero) and the second transmission gate 22, 23 is configured to allow signals to pass through from the second signal input 17 to the output 18 in response to the selection signal input 15 being driven high (logic one). Thus, in the first case (MGC mode), the signal from the pin GC is available at the output 18 of the switching circuit 14, and in the second case (AGC mode), the output of the OpAmp 12 is available at the output 18 of the switching circuit 14.

Normally, in the MGC mode, the pin GC is used as an input pin, i.e., the peripheral system can write the value of the desired gain on the pin GC. However, the inventor has realized that in some peripheral systems, when the AGC mode is activated, it is also required that the value at the output of the OpAmp 12 is read out by the system.

SUMMARY OF THE INVENTION

It is an object of the invention to provide an amplification circuit comprising a variable gain amplifier and an AGC loop for controlling the gain of the variable gain amplifier, wherein an output signal of the AGC loop can be provided to a peripheral system in a simple manner.

According to an aspect of the invention, an amplification circuit is provided, comprising:
  a variable gain amplifier, VGA,
  an automatic gain control, AGC, loop for automatically controlling the gain of the VGA,
  a switching circuit for switching between an AGC mode, in which the gain of the VGA is automatically controlled by an output signal of the AGC loop and a manual gain control, MGC, mode, in which the gain of the VGA can be manually controlled by an input signal, and
  a read/write circuit with a contact for connection to a peripheral system, wherein the read/write circuit is configured, in the MGC mode, to provide the input signal from the contact via a write-mode path to the VGA, and, in the AGC mode, to provide the output signal of the AGC loop via a read-mode path on the contact.

Since the amplification circuit comprises the read/write circuit, the contact can be operated both as an input contact and as an output contact. More precisely, in the MGC mode, the contact can be operated as an input contact, i.e., the peripheral system can write the value of the desired gain on the contact (write mode) and the value is then provided via the write-mode path to the VGA for manually controlling the gain of the VGA. In contrast, in the AGC mode, the contact is used as an output contact (read mode) on which the output signal of the AGC loop—in addition to being used for automatically controlling the gain of the VGA—is provided via the read-mode path.

It is preferred that the switching circuit comprises a selection signal input for inputting a selection signal for selecting the AGC mode or the MGC mode. The selection signal input can be connected to a, e.g. a pin MS (mode selection) as shown in FIG. 1, and can be used to switch between the two modes through a switching circuit. For instance, embodiment, when MS is logic zero, the MGC mode is activated, and when MS is logic one, the AGC mode is activated. Of course, in other embodiments, it can also be the other way around, i.e., when MS is logic zero, the AGC mode is activated, and when MS is logic one, the MGC mode is activated.

It is further preferred that the read-mode path comprises a circuit that is configured to act as a unity gain buffer when the AGC mode is selected by the selection signal. In this case, the peripheral system can read the output signal of the AGC loop without loading the output signal and affecting the gain setting of the VGA.

It is preferred that the circuit is further configured to switch off the read-mode path when the MGC mode is selected by the selection signal. This is because otherwise the AGC loop would also try to set the gain of the VGA, which would lead to a conflict and ultimately a gain setting of the VGA which might not be the desired value to be written by the peripheral system.

It is preferred that the circuit comprises an operational amplifier and an inverter circuit forming a negative feedback loop across the operational amplifier. In this case the dimensions of e.g. the transistors used in the inverter circuit can be chosen so as to provide a certain driving impedance of the circuit. If the AGC loop is configured like it is shown in FIG. 1 (a), this can also increase the driving capabilities of the OpAmp 12.

It is further preferred that the inverter circuit is configured to be disabled when the MGC mode is selected by the selection signal. This is to increase the isolation in the read-mode path when the write-mode path is selected in the MGC mode.

It is preferred that the inverter circuit comprises a CMOS inverter consisting of a PMOS transistor connected to an NMOS transistor and additional switches that are configured to switch off the CMOS inverter from a supply voltage and from ground when the MGC mode is selected by the selection signal. This is to increase the isolation in the read-mode path, when the write-mode path is selected in the MGC mode.

It is further preferred that the circuit comprises a switch that is adapted to switch off the operational amplifier from a bias current when the MGC mode is selected by the selection signal. Switching off the bias current from the operational amplifier leads to very high isolation between its output and its input, which in addition to switching off the CMOS inverter further increases the isolation in the read-mode path when the write-mode path is selected in the MGC mode.

It is preferred that the write-mode path comprises a switch that is configured to switch off the write-mode path when the AGC mode is selected by the selection signal. The switch advantageously increases the impedance of the write-mode path in the read mode (AGC mode), but the desired switching functionality may also be achieved with only the switching circuit.

It shall be understood that a preferred embodiment of the present invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
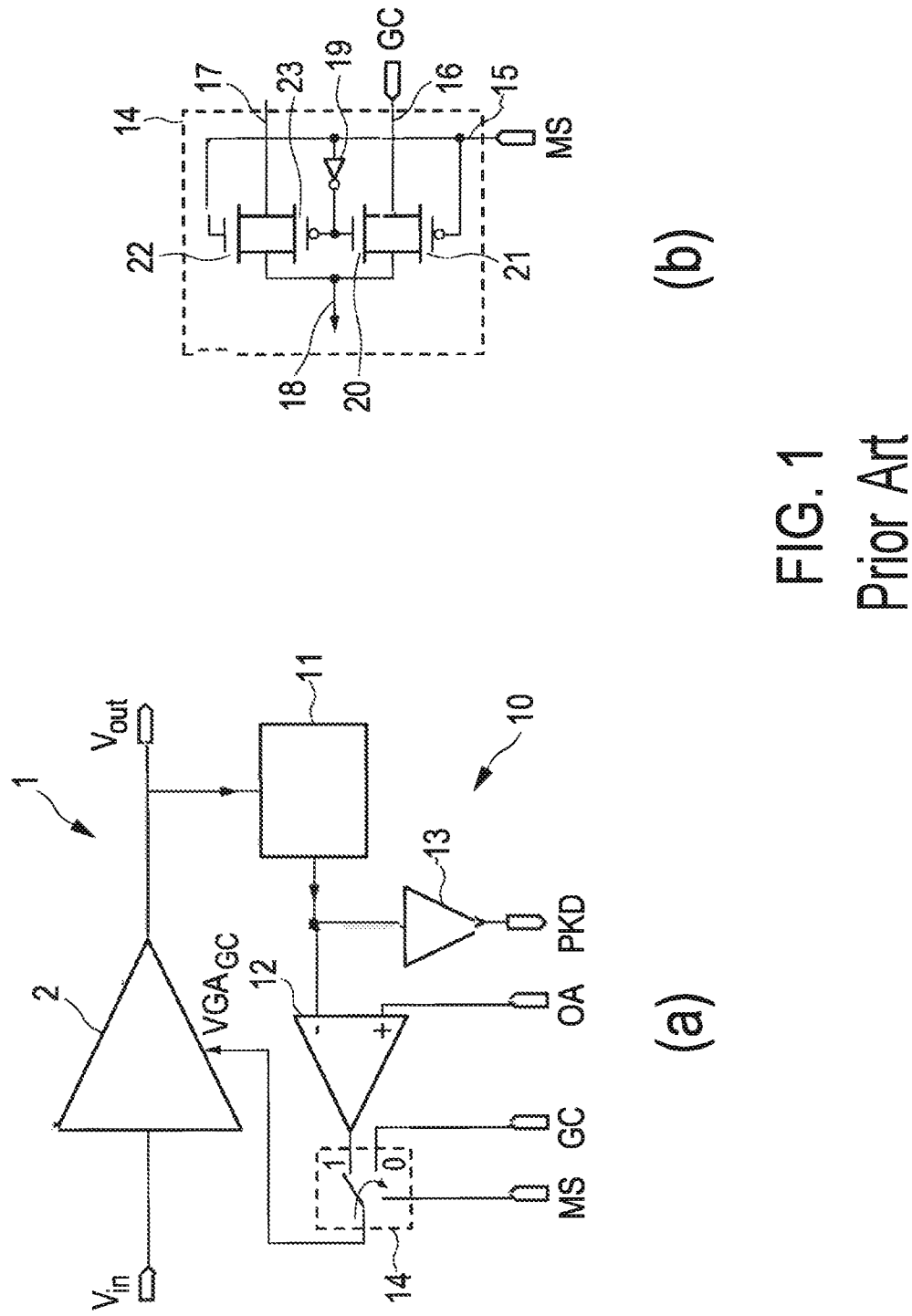
FIG. 1 shows schematically and exemplarily an amplification circuit as it is known in the art.

In the description, like elements or units are referred by like reference numerals. Moreover, if a particular element or unit or its function has been described with reference to a particular figure, the particular element or unit or its function may not be described repeatedly with reference to another figure in which it occurs.

Figure 2:
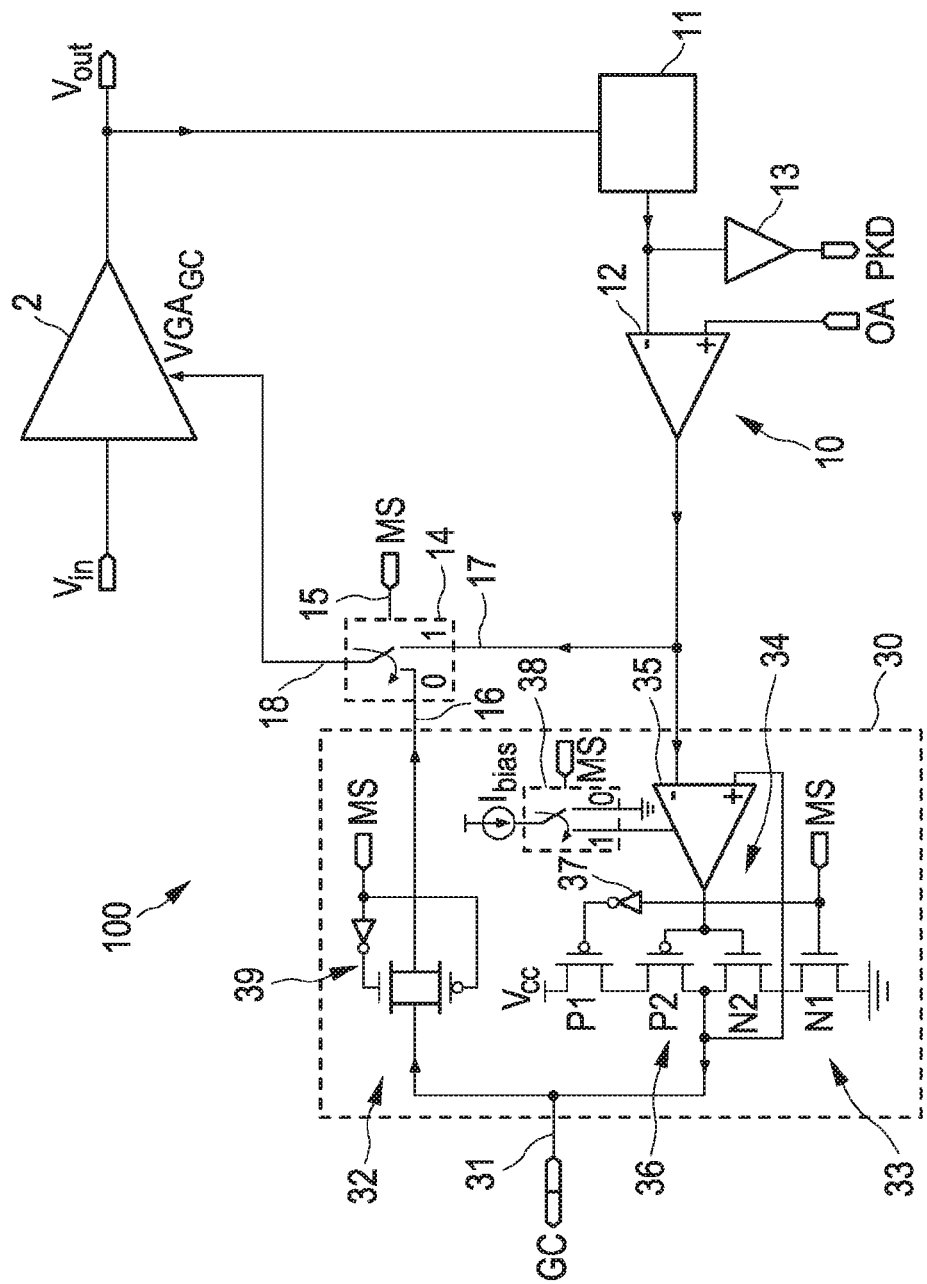
FIG. 2 shows schematically and exemplarily an embodiment of an amplification circuit.

FIG. 2 shows schematically and exemplarily an embodiment of an amplification circuit 100. The amplification circuit 100 comprises a variable gain amplifier, VGA, 2, an automatic gain control, AGC, loop 10 for automatically controlling the gain of the VGA, and a switching circuit 14 for switching between an AGC mode, in which the gain of the VGA 2 is automatically controlled by an output signal of the AGC loop 10 and a manual gain control, MGC, mode, in which the gain of the VGA 2 can be manually controlled by an input signal.

As described above with reference to FIG. 1 (a), the AGC loop 10 comprises a peak detector 11, which outputs a DC signal proportional to the amplitude at the output voltage $V_{out}$ of the VGA 2. The output of the peak detector 11 is compared with the desired output amplitude through an operational amplifier (OpAmp) 12 and the error signal at the output of the OpAmp 12 is used in the AGC mode to automatically set the gain of the VGA 2 to maintain the amplitude of the output voltage $V_{out}$ at a constant level. Here, a pin OA is provided in order to allow the desired output amplitude to be provided by a peripheral system (not shown in the figure). In both modes, the output of the peak detector 11 is available through a buffer 13 on a pin PKD as an output to a peripheral system.

The switching circuit 14 is preferably configured as described above with reference to FIG. 1 (b). It comprises a selection signal input 15, here, connected to a pin MS (mode selection), for inputting a selection signal MS for selecting the AGC mode or the MGC mode. In this embodiment, the MGC mode is selected in response to the selection signal input 15 being driven low (logic zero) and the AGC mode is selected in response to the selection signal input 15 being driven high (logic one). In the first case, the first transmission gate 20, 21 allows signals to pass through from the first signal input 16 to the output 18, and in the second case, the second transmission gate 22, 23 allows signals to pass through from the second signal input 17 to the output 18.

The amplification circuit 100 further comprises a read/write circuit 30 with a contact 31, here, with a pin GC (gain control), for connection to the peripheral system. The read/write circuit 30, in the MGC mode, provides the input signal from the contact 31 via a write-mode path 32 to the VGA 2, and, in the AGC mode, provides the output signal of the AGC loop 10 via a read-mode path 33 on the contact 31. By means of the read/write circuit 30, the contact 31 can be operated both as an input contact and as an output contact. More precisely, in the MGC mode, the contact 31 can be operated as an input contact, i.e., the peripheral system can write the value of the desired gain on the contact (write mode) and the value is than provided via the write-mode path 32 to the VGA 2 for manually controlling the gain of the VGA 2. In contrast, in the AGC mode, the contact 31 is used as an output contact (read mode) on which the output signal of the AGC loop 10—in addition to being used for automatically controlling the gain of the VGA 2—is provided via the read-mode path 33.

The read-mode path 33 comprises a circuit 34 that acts as a unity gain buffer when the AGC mode is selected by the selection signal MS and that switches off the read-mode path 33 when the MGC mode is selected by the selection signal MS.

In more detail, the circuit 34 comprises an operational amplifier 35 and an inverter circuit 36 forming a negative feedback loop across the operational amplifier 35. The inverter circuit 36 increases the current driving capability of the circuit 34 in the read mode (AGC mode), so that loads with low impedance can be driven easily without relying on the current driving capability of the operational amplifier 35 alone. The inverter circuit 36 is disabled when the MGC mode (write mode) is selected by the selection signal MS. To this end, the inverter circuit 36 comprises a CMOS inverter consisting of a PMOS transistor P2 connected to an NMOS transistor N2 and additional switches P1, N1 that switch off the CMOS inverter from a supply voltage $V_{cc}$ and from ground when the MGC mode (write mode) is selected by the selection signal MS. In this embodiment, the switch P1, which switches off the CMOS inverter from the supply voltage $V_{cc}$, is also a PMOS transistor that is connected with its source to the supply voltage $V_{cc}$ and with its drain to the source of the PMOS transistor P2 of the CMOS inverter. Likewise, the switch N1, which switches off the CMOS converter from ground, is also an NMOS transistor that is connected with its source to the drain of the NMOS transistor N2 of the CMOS inverter and with its drain to ground. The gate of the NMOS transistor N1 is operated by the selection signal MS and the gate of the PMOS transistor P1 is operated by an inverted version of the selection signal MS that is inverted by an additional inverter 37.

It is noted that the driving capability of the circuit 34 is preferably enhanced in both directions (sinking and sourcing current) by choosing a high aspect ratio of the dimensions of the transistors N1, N2, P1 and P2, resulting in a low driving impedance for the circuit 34. Since MOS transistors with large aspect ratio (i.e., a large ration of width to length) have a smaller channel resistance when they are on, this means that the load will be connected to either $V_{cc}$ or the ground through a very small resistance, leading to high current driving capability of the circuit 34 in the read mode (AGC mode).

The circuit 34 also comprises a switch 38 that switches off the operational amplifier 35 from a bias current $I_{bias}$ when the MGC mode (write mode) is selected by the selection signal MS. This ensures that the impedance of the read-mode path 33 is very high.

On the other hand, the circuit 32 comprises a switch 39 that switches off the write-mode path 32 when the AGC mode (read mode) is selected by the selection signal MS. In contrast, when the MGC mode (write mode) is selected by the selection signal MS, the switch 39 does not switch off the write-mode path 32 and the input signal from the contact 31 is directly provided via a write-mode path 32 (and the switching circuit 14) to the VGA 2 for manually controlling the gain of the VGA 2. The switch 39 advantageously increases the impedance of the write-mode path 32 in the read mode (AGC mode).

Figure 3:
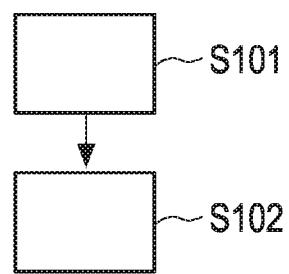
FIG. 3 shows a flowchart exemplarily illustrating an embodiment of a method for operating the amplification circuit of FIG. 2.

FIG. 3 shows a flowchart exemplarily illustrating an embodiment of a method for operating the amplification circuit of FIG. 2.

In step S101, in the MGC mode, the input signal is provided from the contact 31 via the write-mode path 32 to the VGA 2.

In step S102, in the AGC mode, the output signal of the AGC loop 10 is provided via the read-mode path 33 on the contact 31.

With respect to this method, it is noted that the numbering of the steps as S101 and S102 does not imply that the step S101 has to be performed before step S102. Instead, it is also possible that step S102 is performed before step S101 or that the two steps are repeatedly performed.

While in the embodiment of the amplification circuit 100 described with reference to FIG. 2 above, the write-mode path 32 comprises a switch 39 that is configured to switch off the write-mode path 32 when the AGC mode is selected by the selection signal MS, this does not have to be the case in other embodiments. As already mentioned before, the switch 39 advantageously increases the impedance of the write-mode path 32 in the read mode (AGC mode), but the desired switching functionality may also be achieved with only the switching circuit 14.

In the embodiment of the amplification circuit 100 described with reference to FIG. 2 above, when MS is logic zero, the MGC mode is activated, and when MS is logic one, the AGC mode is activated. Of course, in other embodiments, it can also be the other way around, i.e., when MS is logic zero, the AGC mode is activated, and when MS is logic one, the MGC mode is activated.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention relates to an amplification circuit, comprising: a variable gain amplifier, VGA, an automatic gain control, AGC, loop for automatically controlling the gain of the VGA, a switching circuit for switching between an AGC mode, in which the gain of the VGA is automatically controlled by an output signal of the AGC loop and a manual gain control, MGC, mode, in which the gain of the VGA can be manually controlled by an input signal, and a read/write circuit with a contact for connection to a peripheral system, wherein the read/write circuit is configured, in the MGC mode, to provide the input signal from the contact via a write-mode path to the VGA, and, in the AGC mode, to provide the output signal of the AGC loop via a read-mode path on the contact.

What is claimed is:

1. An amplification circuit, comprising:
    a variable gain amplifier, VGA,
    an automatic gain control, AGC, loop for automatically controlling the gain of the VGA,
    a switching circuit for switching between an AGC mode, in which the gain of the VGA is automatically controlled by an output signal of the AGC loop and a manual gain control, MGC, mode, in which the gain of the VGA can be manually controlled by an input signal, and
    a read/write circuit with a contact for connection to a peripheral system, wherein the read/write circuit is configured, in the MGC mode, to provide the input signal from the contact via a write-mode path to the VGA, and, in the AGC mode, to provide the output signal of the AGC loop via a read-mode path on the contact.

2. The amplification circuit as defined in claim 1, wherein the switching circuit comprises a selection signal input for inputting a selection signal for selecting the AGC mode or the MGC mode.

3. The amplification circuit as defined in claim 2, wherein the read-mode path comprises a circuit that is configured to act as a unity gain buffer when the AGC mode is selected by the selection signal.

4. The amplification circuit as defined in claim 3, wherein the circuit is further configured to switch off the read-mode path when the MGC mode is selected by the selection signal.

5. The amplification circuit as defined in claim 4, wherein the circuit comprises an operational amplifier and an inverter circuit forming a negative feedback loop across the operational amplifier.

6. The amplification circuit as defined in claim 5, wherein the inverter circuit is configured to be disabled when the MGC mode is selected by the selection signal.

7. The amplification circuit as defined in claim 6, wherein the inverter circuit comprises a CMOS inverter comprises a PMOS transistor connected to an NMOS transistor and additional switches that are configured to switch off the CMOS inverter from a supply voltage and from ground when the MGC mode is selected by the selection signal.

8. The amplification circuit as defined in claim 7, wherein the circuit comprises a switch that is configured to switch off the operational amplifier from a bias current when the MGC mode is selected by the selection signal.

9. The amplification circuit as defined in claim 8, wherein the write-mode path comprises a switch that is configured to switch off the write-mode path when the AGC mode is selected by the selection signal.

10. A method for operating an amplification circuit as defined in claim 1, comprising:
   in the MGC mode, providing the input signal from the contact via the write-mode path to the VGA, and
   in the AGC mode, providing the output signal of the AGC loop via the read-mode path on the contact.

11. The amplification circuit as defined in claim 3, wherein the circuit comprises an operational amplifier and an inverter circuit forming a negative feedback loop across the operational amplifier.

12. The amplification circuit as defined in claim 11, wherein the inverter circuit is configured to be disabled when the MGC mode is selected by the selection signal.

13. The amplification circuit as defined in claim 12, wherein the inverter circuit comprises a CMOS inverter comprising a PMOS transistor connected to an NMOS transistor and additional switches that are configured to switch off the CMOS inverter from a supply voltage and from ground when the MGC mode is selected by the selection signal.

14. The amplification circuit as defined in claim 5, wherein the circuit comprises a switch that is configured to switch off the operational amplifier from a bias current when the MGC mode is selected by the selection signal.

15. The amplification circuit as defined in claim 2, wherein the write-mode path comprises a switch that is configured to switch off the write-mode path when the AGC mode is selected by the selection signal.

* * * * *